United States Patent
Goodson, II et al.

(10) Patent No.: US 11,262,829 B2
(45) Date of Patent: Mar. 1, 2022

(54) POWER SUPPLY HAVING A THRESHOLD INDICATOR TO PERFORM A SHUTDOWN OPERATION BASED ON VOLTAGE OF A BULK CAPACITOR

(71) Applicant: HEWLETT PACKARD ENTERPRISE DEVELOPMENT LP, Houston, TX (US)

(72) Inventors: Stewart G. Goodson, II, Houston, TX (US); Daniel Humphrey, Tomball, TX (US); Robin K. Schrader, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 132 days.

(21) Appl. No.: 16/424,831

(22) Filed: May 29, 2019

(65) Prior Publication Data
US 2020/0379535 A1 Dec. 3, 2020

(51) Int. Cl.
G06F 1/30 (2006.01)
G01R 31/40 (2020.01)

(52) U.S. Cl.
CPC ............... *G06F 1/30* (2013.01); *G01R 31/40* (2013.01)

(58) Field of Classification Search
None
See application file for complete search history.

(56) References Cited

U.S. PATENT DOCUMENTS

| | | |
|---|---|---|
| 9,098,278 B1 | 8/2015 | Nay |
| 10,019,329 B2 | 7/2018 | Kelly et al. |
| 2005/0086543 A1* | 4/2005 | Manuell ............... G06F 11/3006 713/300 |
| 2012/0126790 A1* | 5/2012 | Sobotka ................. G08C 19/28 324/119 |
| 2014/0266293 A1* | 9/2014 | Ye .............................. G06F 1/30 324/764.01 |
| 2016/0054771 A1* | 2/2016 | Fallon ....................... G06F 1/26 713/300 |
| 2017/0091042 A1 | 3/2017 | Chou et al. |
| 2017/0242467 A1 | 8/2017 | Kelly et al. |

OTHER PUBLICATIONS

Florian Frimmel, "Fujitsu FJBU: the Better Alternative to Classic UPS," Fujitsu TechCommunity, Nov. 7, 2015, pp. 1-5 (online), Retrieved from the Internet on Dec. 20, 2018 at URL: <techcommunity.ts.fujitsu.com/en/servers/d/uid-de379310-5f6b-272a-b0f5-d881d5583edc.html>.

Philip T. Krein, "Data Center Challenges and Their Power Electronics," CPSS Transactions on Power Electronics and Applications, Mar. 2017, pp. 39-46, vol. 2, No. 1.

* cited by examiner

*Primary Examiner* — Danny Chan
(74) *Attorney, Agent, or Firm* — Nolte Lackenbach Siegel

(57) ABSTRACT

A power supply may include a power input to connect to a power source to receive an input power for the power supply, a bulk capacitor operatively connected to the power input, and a threshold manager having a processor operatively connected to the power input and the bulk capacitor. The threshold manager to monitor the input power, calculate a threshold to perform a shutdown operation based on a shutdown requirement provided by a computing device, and in response to a power loss of the input power, monitor a bulk voltage of the bulk capacitor and send an alert to the computing device to perform the shutdown operation when the bulk voltage meets the threshold.

16 Claims, 7 Drawing Sheets

POWER SUPPLY HAVING A THRESHOLD INDICATOR TO PERFORM A SHUTDOWN OPERATION BASED ON VOLTAGE OF A BULK CAPACITOR

BACKGROUND

Computing devices have power supplies that receive primary power from external sources. In certain circumstances, the primary power source may be interrupted temporarily, and the computing device may shutdown or otherwise rely on backup power sources until the primary power source returns. The shutdown operations may thereby result in the computing device being unavailable for a period of time when the primary power source is not providing power as expected.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
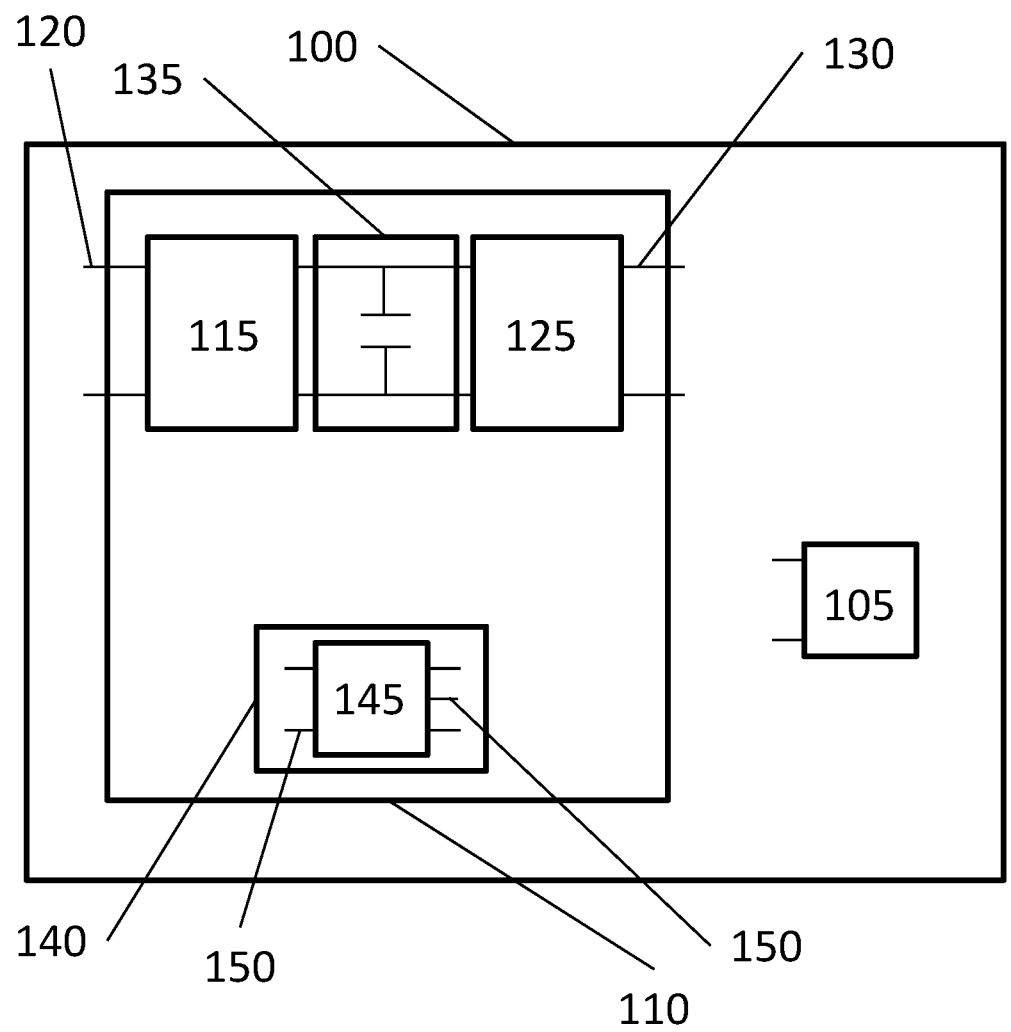
FIG. 1 is a schematic representation of a computing device, according to one or more examples of the disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Computing devices, such as servers, use power supplies that receive energy in the form of electric current from a source. The source may vary depending on the specific implementation, but a common source includes utility power grids. Utility power grids provide generally reliable sources of electricity; however, in certain circumstances, utility power grids may experience intentional or unintentional disruptions in their supplied power, such as brief drops in voltage, or even complete loss of power, etc. Some of these disruptions, such as the drops in voltage, may occur for a relatively small amount of time, such as 20 milliseconds; however, even relatively short disruptions may cause computing devices to shut down or otherwise become unavailable. In particular, some computing devices are designed to initiate a shutdown operation when the power supply indicates that the input power has been lost in order to avoid losing important data.

For example, computing devices generally store some data in volatile memory, such as data going through a buffer, data stored in a processor cache, or data in another volatile location like main memory (RAM). Volatile memory refers to computer storage that maintains data as long as the computing device is powered. In contrast, non-volatile memory refers to computer memory that can retrieve stored information after being powered down. If the computing device loses power, the data in the volatile memory may be lost. In order to prevent the loss of data as a result of a loss of power, computing devices may perform a shutdown operation when a loss of power is detected. The shutdown operation may include transferring at least a portion of data in volatile memory to non-volatile memory while there is remaining power (e.g., in the bulk capacitor of the power supply), and then turning the computing device off.

While the process of performing a shutdown when a loss of power is detected may prevent loss of data, if the loss of power is really only a brief disruption (such as a brief voltage drop) then the shutdown may be unnecessary. For example, if the duration of the loss of input power is brief enough (e.g., less than around 20 milliseconds), the computing device may have sufficient remaining power (e.g., in the bulk capacitor of the power supply) to continue operating until the power returns to normal without losing any data. Thus, a shutdown of the computing device in such a scenario would be unnecessary. Additionally, even computing devices that are connected to backup solutions, such as an uninterruptible power supply ("UPS"), may initiate a shutdown operation before the UPS or other backup solution can be activated. The unnecessary shutdown operations may take computing devices out of operation for periods of time, thereby decreasing operational efficiency.

The present disclosure may provide systems and methods for preventing unnecessary shutdown operations by, for example, providing a shutdown notification from the power supply of a computing device when the remaining charge in the bulk capacitor has dropped to a threshold level, rather than providing the notification as soon as power loss is detected. Thus, in examples described herein, the shutdown notification is only sent if the disruption in the input power lasts long enough that the remaining energy in the bulk capacitor is depleted to the threshold amount. Generally brief disruptions in the input power would not last long enough for the remaining energy to be depleted to the threshold, and thus the shutdown notification is generally not sent when such brief disruptions occur. Thus, the computing device can avoid most of the unnecessary shutdowns resulting from brief power disruptions.

Furthermore, in examples described herein the threshold may be determined by the power supply so as to correspond roughly to the minimum amount of energy, power, voltage, etc., stored in the bulk capacitor that would be needed to enable the computing device to perform a shutdown operation. This ensures that, if the disruption in the power is a more serious long-lasting event, the computing device will still be able to perform a shutdown operation since the shutdown notification is sent when there is just enough energy left to complete the shutdown.

To enable the power supply to determine the threshold, the computing device may provide to the power supply some information about the computing device such as, for example, an estimated duration of a shutdown operation. The estimated duration of the shutdown operation may represent the amount of time it will take to move the data in volatile memory to non-volatile memory, and perform any other operations that are needed. The computing device may also provide an indication of the minimum output voltage needed to perform the shutdown operation. Based on this information and characteristics of the power supply, the power supply may determine a minimum bulk voltage at which there is enough remaining energy to power the shutdown operation, and this voltage may be set as the threshold ("bulk voltage" refers to the voltage of the bulk capacitor). Thus, the threshold may be set to a level that is tailored to the specific needs of the computing device based on input from the computing device.

The power supply may monitor the input voltage into the power supply, and when a power loss is detected, such as when a voltage loss occurs that results in the input voltage being outside of a normal range, the power supply may monitor the bulk voltage to see if it drops to the threshold level. In some examples, the power supply may also enter a special operating mode when power loss is detected, in which, for example, patterns of communication between components of the power supply are changed to prioritize communications related to the power loss event (e.g., communications of measurements of the input voltage level, the bulk voltage, etc.) If the bulk voltage decreases to a point that meets or exceeds the threshold, the power supply may alert the computing device to begin a shutdown operation, as noted above. However, as the power supply continues to monitor the input voltage and the bulk voltage, if the input voltage returns to normal and the bulk voltage does not meet or exceed the threshold, the computing device may continue to operate without intervention. As such, during a temporary loss of power, rather than shutting down, the computing device may continue to operate as normal, thereby allowing time for the power loss to be corrected. When temporary losses of power occur, rather than initiate a shutdown operation, the power supply may alert the computing device when only enough power remains to complete the shutdown operation. Such systems and methods may prevent unnecessary shutdown operations, allowing computing devices to continue operating during short period of power loss.

Turning to FIG. 1, a schematic representation of an example computing device 100, according to one or more examples of the disclosure is shown. Computing device 100 may include various types of devices such as, for example, servers, desktops, laptops, and the like. Computing device 100 includes a system processor 105 and a power supply 110 that provides main power to the system processor 105. Computing device 100 may also include other components that are not explicitly illustrated for clarity in describing example implementations.

System processor 105 may include or otherwise be a component of processing circuitry of the computing device, which may include, for example, a board management controller ("BMC"), a complex programmable logic device ("CPLD"), a main processor (e.g., central processing unit), an application specific integrated circuit ("ASIC"), a field-programmable gate array ("FPGL"), or other types of system processors 105 that may be used in computing devices 100. System processor 105 may process certain data for use in other components of computing device 100 and power supply 110, which will be described in detail below.

Power supply 110 supplies power to computing device 100 by pulling a required amount of electricity from a power source (e.g., a mains power line) and converting the input power into a form that is suitable for use by the computing device 100. For example, the power supply may convert an alternating current ("AC") input power to a direct current ("DC") output power. As another example, the power supply may convert a DC input power to a DC output power having a different voltage. Power supply 110 may include various components, an example of which is illustrated in FIG. 1. In other implementations, power supply 110 may include different components that are not explicitly illustrated herein.

In this example, power supply 110 includes a primary stage 115 that is connected to the power source through a power input 120, thereby providing electricity to power supply 110. Primary stage 115 may include one or more transformers that provide safety isolation between power input 120 and other components of power supply 110. Power supply 110 may also include a secondary stage 125 that may also include one or more transformers. As secondary stage 125 is an output stage, secondary stage 125 may regulate output voltage from power supply 110 to components of computing device 100. Secondary stage 125 may supply power to components of computing device 100 through one or more power outputs 130.

Power supply 110 may also include a bulk capacitor 135 electrically connected to the primary stage 115 and secondary stage 125. Bulk capacitor 135 may store energy between primary stage 115 and secondary stage 125. As such, bulk capacitor 135 may be used to prevent an output from dropping when input current drops for a period of time. While bulk capacitor 135 is illustrated as a single component, in operation, bulk capacitor 135 may include two or more capacitors operatively connected to provide functionality as bulk capacitor 135.

Power supply 110 may further include a threshold manager 140. Threshold manager 140 may include a processor 145 that provides functionality to monitor aspects of power supply 110 and computing device 100, which will be discussed in detail below. In certain implementations, threshold manager 140 may include other types of devices and circuits rather than processor. For example, threshold manager 140 may include microcontrollers, an ASIC, a FPGA, a CPLD, and the like. As illustrated herein, processor 145 may be a component of a microcontroller (not shown), or other circuitry as provided above, and as such, threshold manager 140 may also include an integrated circuit that includes processor 145, memory (not shown), and other components that allow for the processing and storing of data therein.

In operation, threshold manager 140 may include one or more inputs and outputs ("I/O") 150. I/O 150 may operatively connect threshold manager 140 to power input 120, primary stage 115, secondary stage 125, bulk capacitor 135, system processor 105, and/or other components of computing device 100 and or power supply 110. For example, I/O 150 may allow threshold manager 145 to monitor an input voltage through power input 120 and/or primary stage 115. In certain implementations, monitoring the input voltage may occur substantially continuously, such as receiving input voltage data in fractions of a second, such as once every microsecond. In other implementations, threshold manager 140 may receive input voltage data in other intervals, such as every several microseconds, milliseconds, or the like. Should a drop in the input voltage occur, threshold manager 140 may be informed of the input voltage drop and continue to monitor the input voltage to determine when the input voltage returns to a normal operating condition.

In addition to monitoring the input voltage, threshold manager 140 may also monitor bulk capacitor 135. By monitoring bulk capacitor 135, threshold manager 140 may receive input data representative of the bulk voltage of bulk capacitor 135. Bulk voltage refers to the voltage across bulk capacitor 135 and is representative of the energy stored in bulk capacitor 135. As explained above with respect to monitoring the input voltage, monitoring bulk voltage may occur substantially continuously, thereby allowing threshold manager 140 to know the amount of bulk voltage available.

Threshold manager 140 may further include functionality to determine a threshold, which when met, may instruct computing device 100 to perform a shutdown operation. As used herein, the threshold may refer to a threshold of a parameter that is indicative of an amount of electrical energy that is stored in the bulk capacitor (i.e., a parameter from which the amount of stored energy may be determined or derived in view of other known parameters). In the examples described below, the parameter is the bulk voltage and the threshold is a threshold voltage. However, any other parameter that is indicative of the amount of stored energy could be used instead, such as the charge difference between the capacitor plates. As noted above, the threshold is set to a value that corresponds roughly to the minimum amount of energy storage in the capacitor that would be needed to enable the power supply 110 to provide enough power to allow computing device 100 to perform the shutdown operation.

To determine the threshold, threshold manager 140 may receive a shutdown requirement from system processor 105. The shutdown requirement may include various data that threshold manager 140 may use to determine when the shutdown operation may be performed. For example, the shutdown requirement may include energy requirement information, and an indication of the minimum output voltage that needs to be maintained to perform the shutdown operation. The energy requirement information may directly indicate an amount of energy that is needed to complete the shutdown operation, or it may include information from which the threshold manager 140 can derive the amount of energy that is needed. For example, the energy requirement information may include an amount of time that is needed to perform the shutdown operation and an estimate of the average power requirement of the computing device 100 during the shutdown operation. The time to perform the shutdown operation may refer to the amount of time it would take to transfer data in volatile memory to non-volatile memory without data loss. The minimum output voltage to complete the shutdown operation may refer to the minimum voltage for a component that uses the largest amount of voltage in a group of components. Said another way, if a device includes three components and the minimum voltage required by the components are individually 11.2V, 11.0V, and 10.8V, the minimum output voltage to complete the shutdown would be the minimum voltage required by the device using the largest amount of voltage, which in this example is the device using 11.2V. The indication of energy or power may include, for example, an average power consumed by computing device 100 or a fixed amount of energy that may be predefined based on components of computing device 100 that are in use during a shutdown operation.

In addition to receiving the shutdown requirement from system processor 105, threshold manager 140 may either be provided or otherwise include information about power supply 110. For example, threshold manager 140 may include the capacitance of the bulk capacitor, i.e., the bulk capacitance, and an output converter transfer ratio. The bulk capacitance may thus refer to the amount of energy that may be stored in bulk capacitor 135. The bulk capacitance may be adjusted to take into consideration a decrease in storage capability of bulk capacitor 135 as a result of time in use. For example, a new bulk capacitor 135 may have greater storage capacity compared to a bulk capacitor 135 that has been in use for several years. As such, bulk capacitance may include a value that is determined based on the amount of time bulk capacitor 135 has been in use. In other implementations, the bulk capacitance may refer to a known or otherwise calculated value that relates to the storage capacity of bulk capacitor 135 when in operation for a specified amount of time, e.g., two years, three years, four years, and the like. In certain implementations, as a safety margin, bulk capacitance may include a value that represents a maximum storage ability at the end-of-life for bulk capacitor 135.

Output converter transfer ratio may refer to the ratio of transformation or the turn-ratio of the transformer. This value may be provided to threshold monitor 140 at the time of manufacture or subsequently during use of power supply 110. The output converter transfer ratio may be different for each power supply 110, as the transformers used therein may vary according to operational requirements.

Threshold manager 140 may determine the threshold based on the shutdown requirements provided from system processor 105, as well as provided variables, such as the bulk capacitance and the output converter transfer ratio. While other methods of calculating the threshold are contemplated, one option for calculating the threshold is provided below.

To calculate the threshold, threshold manager 140 may be provided the bulk capacitance, C, and the output converter transfer ratio, $T_R$. System processor 105 may provide threshold manager 140 the required time to perform a shutdown operation, t, a minimum output voltage, $V_{MIN}$, and an average power $P_{AVG}$. Using the provided information, threshold manager 140 may calculate a cutoff bulk voltage level, $V_{BULK, CUTOFF}$, that represents the minimum bulk voltage that, when fed into the secondary stage 125, generates an output voltage that is equal to the minimum output voltage $V_{MIN}$. The cutoff bulk voltage level may be calculated according to the following equation:

$$V_{BULK,CUTOFF} = V_{MIN}/T_R$$

Threshold manager 140 may also calculate the energy required to perform the shutdown operation. The energy required to perform the shutdown operation may be determined based on properties of the components of computing device 100 that are used during a shutdown process. For example, during the shutdown process, one or more processors, memories, storage devices, fans, peripheral component interconnect express ("PCIe") devices, and the like may be in use. Each component may have different nominal power requirements representing an expected or typical power draw of the component. The power requirements for the components in use may thereby allow the average power of computing device to be determined by computing device 100, for example by summing the power requirements of each of the components that will be in use during the shutdown operation. As another example, actual power usage of the computing device 100 may be tracked, and the actual power usage values may be used to determine an average power draw $P_{AVG}$ of the computing system 100. In some examples, actual power drawn during previous shutdown operations may be used to determine the average power $P_{AVG}$. To determine the energy required to perform the shutdown operation, the average power may be multiplied by the required time to perform the shutdown operation according to the following equation:

$$E_{REQUIRED} = P_{AVG} \cdot t$$

With the cutoff bulk voltage level and the energy required to perform the shutdown operation, the threshold may be calculated. In this example, the threshold $V_{THRESHOLD}$ represents the bulk voltage of the bulk capacitor when it has just enough usable energy stored to enable the shutdown operation to be completed without the output voltage dropping below $V_{MIN}$ during the operation. In other words, if the shutdown operation begins when the bulk voltage is at $V_{THRESHOLD}$, performing the shutdown operation will drain the bulk capacitor to the point that the bulk voltage is $V_{BULK,CUTOFF}$ upon completion of the shutdown. $V_{THRESHOLD}$ may be calculated according to the following equation:

$$E_{REQUIRED} = 1/2 \cdot C \cdot (V_{THRESHOLD}^2 - V_{BULK,CUTOFF}^2)$$

Rearranging the above equation and substituting the $E_{REQUIRED}$ and $V_{BULK,CUTOFF}$ gives the following equation for $V_{THRESHOLD}$:

$$\sqrt{\frac{2 \cdot P_{AVG} \cdot t}{C} + \left(\frac{V_{MIN}}{T_R}\right)^2} = V_{THRESHOLD}$$

While in this example average power was used to determine the threshold in terms of a voltage, in other implementations the threshold may be calculated based on, for example, a fixed amount of energy. As such, the threshold may refer to a value that allows a shutdown operation to occur regardless of the units in which the value is represented.

In operation, threshold manager 140 may use the threshold in determining when to alert computing device 100 to perform the shutdown operation. In an example implementation, system processor 105 may have provided threshold manager 140 the shutdown requirement and threshold manager 140 may have calculated the threshold. As threshold manager 140 monitors the input voltage and bulk voltage, threshold manager 140 may detect a loss in input voltage. Rather than signal computing device 100 to perform a shutdown operation, threshold manager 140 may continue to monitor the input voltage and bulk voltage. If the input voltage returns to normal, threshold manager 140 may take no further action. In such an example, threshold manager 140 may continue to monitor input voltage and bulk voltage until another loss in input voltage occurs.

In an example when the input voltage does not return to normal operating conditions, threshold manager 140 may continue to monitor the input voltage and bulk voltage. If the bulk voltage meets the threshold value, threshold manager 140 may then signal computing device 100 to begin the shutdown operation. To signal computing device 100 to begin the shutdown operation, threshold manager 140 may send an alert signal to system processor 105 or another components of computing device 100.

In certain implementations, system processor 105 may continue to send shutdown requirements to threshold manager 140, and as such, the threshold may be calculated in a real-time or substantially real-time basis. As used herein, real-time and substantially real-time may refer to the calculation being performed as updated shutdown requirements are sent to threshold manager 140, and as such, may occur in a matter of microseconds or milliseconds. By providing for dynamic updating of the threshold value based on current operating conditions of computing device 100, the threshold value may be recalculated to account for changes in the operation of computing device 100. For example, in certain implementations, computing device 100 may have little data in volatile memory, and as such, the voltage to perform the shutdown operation may be relatively low and/or the time required may be relatively small. In such a circumstance, threshold manager 140 may calculate a threshold that requires less energy in bulk capacitor 135. As such, computing device 100 may be able to withstand a longer loss of input voltage and/or continue normal operation for a longer period of time before a shutdown operation may occur.

In another implementation, computing device 100 may have a large amount of data in volatile memory, and the voltage and/or time to move such data to non-volatile memory may be greater. For example, the amount of voltage may be greater due to the number of processors, number of hard drives, number of fans, etc., that may be used during the data transference. As system processor 105 may provide threshold manager 140 updated shutdown requirements based on current use metrics of computing device 100, threshold manager 140 may calculate a threshold that allows computing device 100 to remain in operation as long as possible before a shutdown operation occurs.

While threshold manager 140 in FIG. 1 has one processor 145, thereby providing functionality for monitoring and calculating the threshold in a single processor, in other implementations, the monitoring and calculating the threshold may occur across two or more processors. Other implementations are explained in detail below with respect to FIG. 2.

Figure 2:
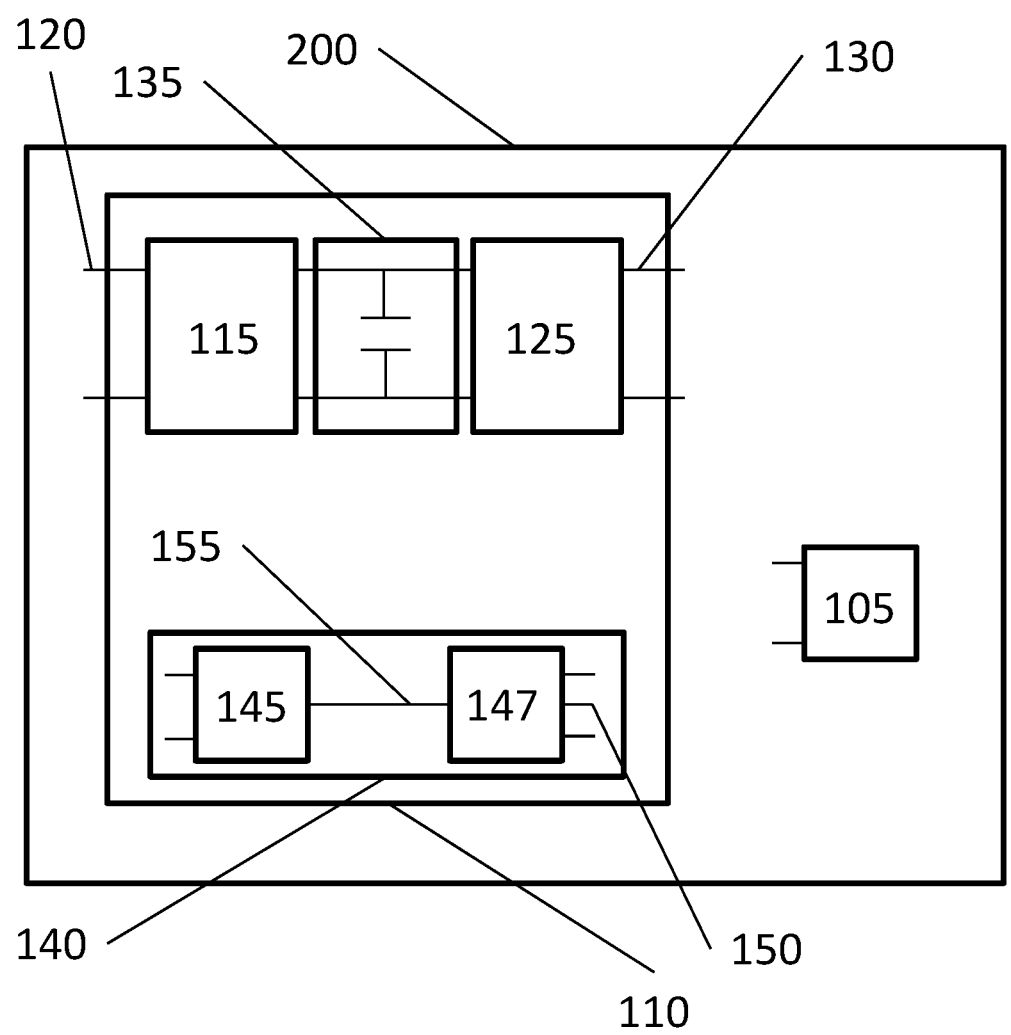
FIG. 2 is a schematic representation of a computing device, according to one or more examples of the disclosure.

Turning to FIG. 2, a schematic representation of a computing device 200, according to one or more examples of the disclosure is shown. In this example, computing device 200 may include similar components to those discussed above with respect to FIG. 1. In this implementation, computing device 200 includes a system processor 105 and a power supply 110. The system processor 105 and power supply 110 may include the components and functionality as explained above. Power supply 110 may include a primary stage 115 having one or more power inputs 120, a secondary stage 125 having one or more power outputs 130, and a bulk capacitor 135. Power supply 110 may further include a threshold manager 140.

In this implementation, threshold manager 140 may include a first processor 145 and a second processor 147. First processor 145 and second processor 147 may be operatively connected through, for example, a communication bus 155. Communication bus 155 may thereby allow high speed communication between first processor 145 and second processor 147, as will be explained in detail below.

First processor 145 and second processor 147 may include different functionalities, while working together to monitor power supply 110. For example, first processor 145 may be operatively connected to primary stage 115 and/or power input 120 through I/O connection 150. As such, first processor 145 may receive data representing input voltage from either primary stage 115 or power input 120, thereby allowing first processor 145 to detect a loss of power. Similarly, first processor 145 may monitor bulk capacitor 135 to determine the bulk voltage available therefrom.

Second processor 147 may be operatively connected to system processor 105 through one or more electrical connections, such as I/O connections 150. As such, second processor 147 may send and receive data to and from system processor 105. For example, second processor 147 may receive shutdown requirements from system processor 105 and may send alerts indicating when to perform a shutdown operation to system processor 105. Second processor 147 may also be operatively connected to secondary stage 125, thereby allowing second processor 147 to monitor the functionality of secondary stage 125. In other implementations, first processor 145 and/or second processor 147 may be operatively connected to various other components of power supply 110 and/or computing device 100. For example, in certain implementations second processor 147 may be connected to primary stage 115 and/or bulk capacitor 135, while first processor 145 may be connected secondary stage 125 and/or system processor 105.

During normal operating conditions; i.e., before a loss of power is detected, first processor 145 and second processor 147 may exchange information about power supply 110 and/or computing device 100. For example, first processor 145 may send bulk voltage data, input voltage data, power reporting data, and/or other energy information to second processor 147. As used herein, energy information may generally refer to information about components of power supply that may be provided to and used by threshold manager 140. As such, energy information may include any information and/or data that is collected from any component of power supply 110. Second processor 147 may either user the data in performing calculations, store the data, or otherwise provide the data to system processor 105. However, when a loss of power is detected, the communication between first processor 145 and second processor 147 may be modified.

In operation, first processor 145 may detect a loss of power to power supply 110. First processor 145 may then alert second processor 147 that input voltage has fallen out of normal operating conditions through communication bus 155. After the loss of input voltage, first processor 145 may change its normal communication and monitoring to substantially continuously send the bulk voltage to second processor 147. First processor 145 may continue to monitor the input voltage in order to determine when input voltage returns to normal operating conditions. In sending the bulk voltage to second processor 147, first processor 145 may lower the priority of other types of energy information. For example, first processor 145 may only send bulk voltage with a header packet to second processor 147, thereby increasing the speed with which second processor 147 receives the bulk voltage. In certain implementations, first processor 145 may only send bulk voltage, while in other implementations, first processor 145 may send bulk voltage with greater frequency than other energy information. In either implementation, first processor 145 may send bulk voltage to second processor 147 at an accelerated rate.

First processor 145 may continue to send the bulk voltage to second processor 147 at an accelerated rate until the power returns to normal operating conditions. In certain situations, second processor 147 may send a signal to first processor 145 instructing first processor 145 to return to normal operating condition. In either situation, first processor 145 may stop sending bulk voltage at an accelerated rate and thereby return to monitoring the input voltage and bulk voltage under normal conditions.

As explained above threshold manager 140 may include functionality to calculate a threshold. In this implementation, the threshold may be calculated by second processor 147. System processor 105 may send shutdown requirements to second processor 147. Second processor 147 may then calculate the threshold based on the shutdown requirements and other provided values, such as a bulk capacitance and output converter transfer ratio, as explained in detail above. Second processor 147 may calculate the threshold one time, as a worst-case scenario, or may update the threshold value based on updated shutdown requirements provided by system processor 105. In other implementations, second processor 147 may recalculate the threshold according to a predefined schedule, such as every second, every 10 seconds, every minute, etc.

In a situation where a loss of power is detected by first processor 145, first processor 145 may initiate accelerated bulk voltage transfer to second processor 147. Second processor 147 may compare the bulk voltage to the calculated threshold and, when the bulk voltage meets or exceeds the threshold value, alert system processor 105 to begin a shutdown operation. Second processor 147 may then instruct first processor 145 to return to normal operation or may perform no subsequent action.

In certain implementations, while first processor 145 is sending bulk voltage at an accelerated rate to second processor 147, second processor 147 may receive additional shutdown requirements from system processor 105. As such, second processor 147 may recalculate the threshold in real-time or substantially real-time to allow computing device 100 to remain in operation as long as possible. As such, should the input voltage return to a normal operating condition while there is enough bulk voltage to perform the shutdown operation, computing device 100 may not be shutdown prematurely.

The operational process for monitoring power supply 110 for a voltage loss and determining when to instruct computing device 100 to perform a shutdown operation is explained further in FIGS. 3-7.

Figure 3:
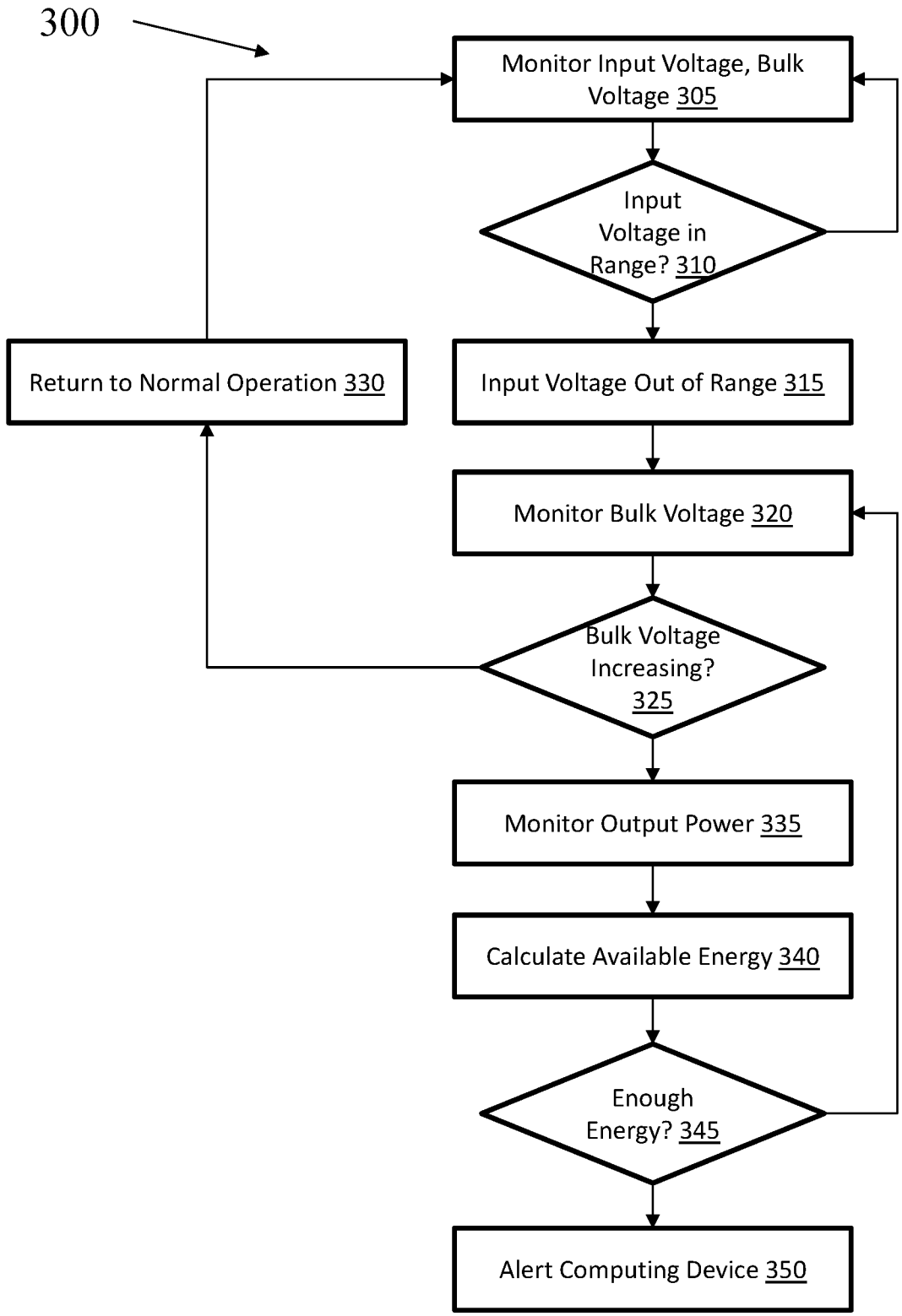
FIG. 3 is a flowchart depicting a method for monitoring a computing device, according to one or more examples of the disclosure.

Turning to FIG. 3, a flowchart depicting a method 300 for monitoring a computing device, according to one or more examples is shown. In this implementation, one or more components of a power supply may monitor (block 305) input voltage and bulk voltage. For example, a threshold manager having one or more processors may be operatively connected to a power input and/or a bulk capacitor, thereby allowing the threshold manager to receive data representing input voltage and bulk capacitance therefrom.

A determination (block 310) of whether input voltage is in a specified range may then be made. The specified range may vary according to the operational requirements for a power supply and/or computing device. Examples of normal operating ranges may include voltage between 100 volts and 240 volts. Other normal operating ranges taking into consideration tolerances may include voltage between 90 volts and 264 volts.

If an input voltage is within range, the monitoring may continue. If an input voltage is out of range (block 315), monitoring (block 320) the bulk voltage may continue. Monitoring the bulk voltage may include substantially continuously receiving bulk voltage data from the bulk capacitor. The data may be received by, for example, the threshold manager, and one or more processors of the threshold manager may exchange the bulk voltage data.

The threshold manager may then determine whether the bulk voltage is increasing (block 325). Increasing bulk voltage may provide an indication that power loss is no longer occurring, and the input voltage has returned to a normal range. As such, the threshold manager may return (block 330) to normal operation. If the bulk voltage is not increasing, the threshold manager may continue to monitor (block 335) output power. The threshold manager may also calculate (block 340) available energy. The calculation of available energy may take into consideration the amount of bulk voltage available from the bulk capacitor.

The threshold manager may further use a threshold, as explained above in order to determine if there is enough energy (block 345). For example, if the calculated available energy is greater than that used in a shutdown operation, the threshold manager may continue to monitor the bulk voltage. However, if the calculated available energy meets the available bulk voltage, the threshold manager may alert (block 350) a computing device, and the device may begin a shutdown operation.

Figure 4:
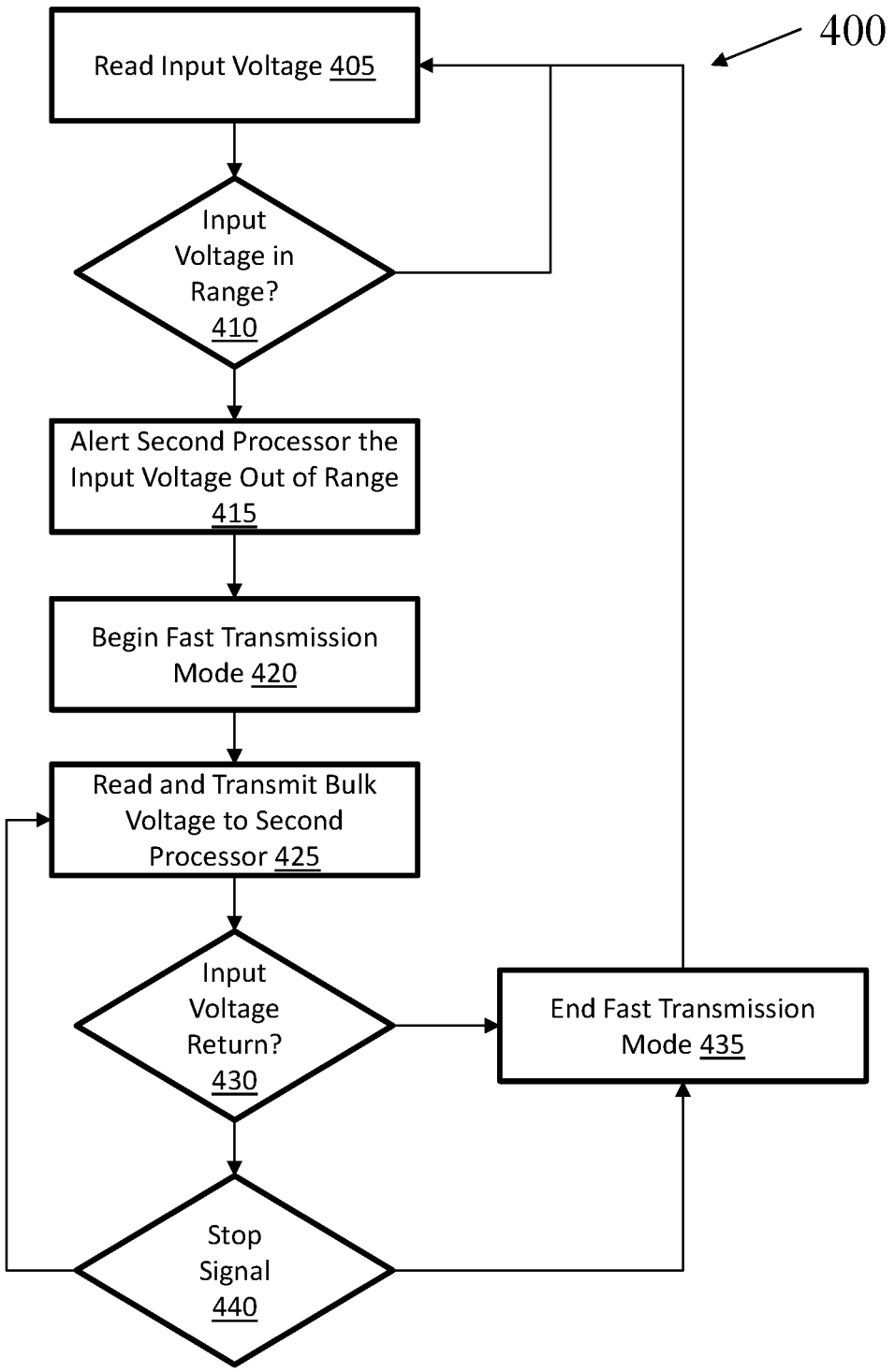
FIG. 4 is a flowchart depicting a method of operation of a first processor in a threshold manager, according to one or more examples of the disclosure.
Figure 5:
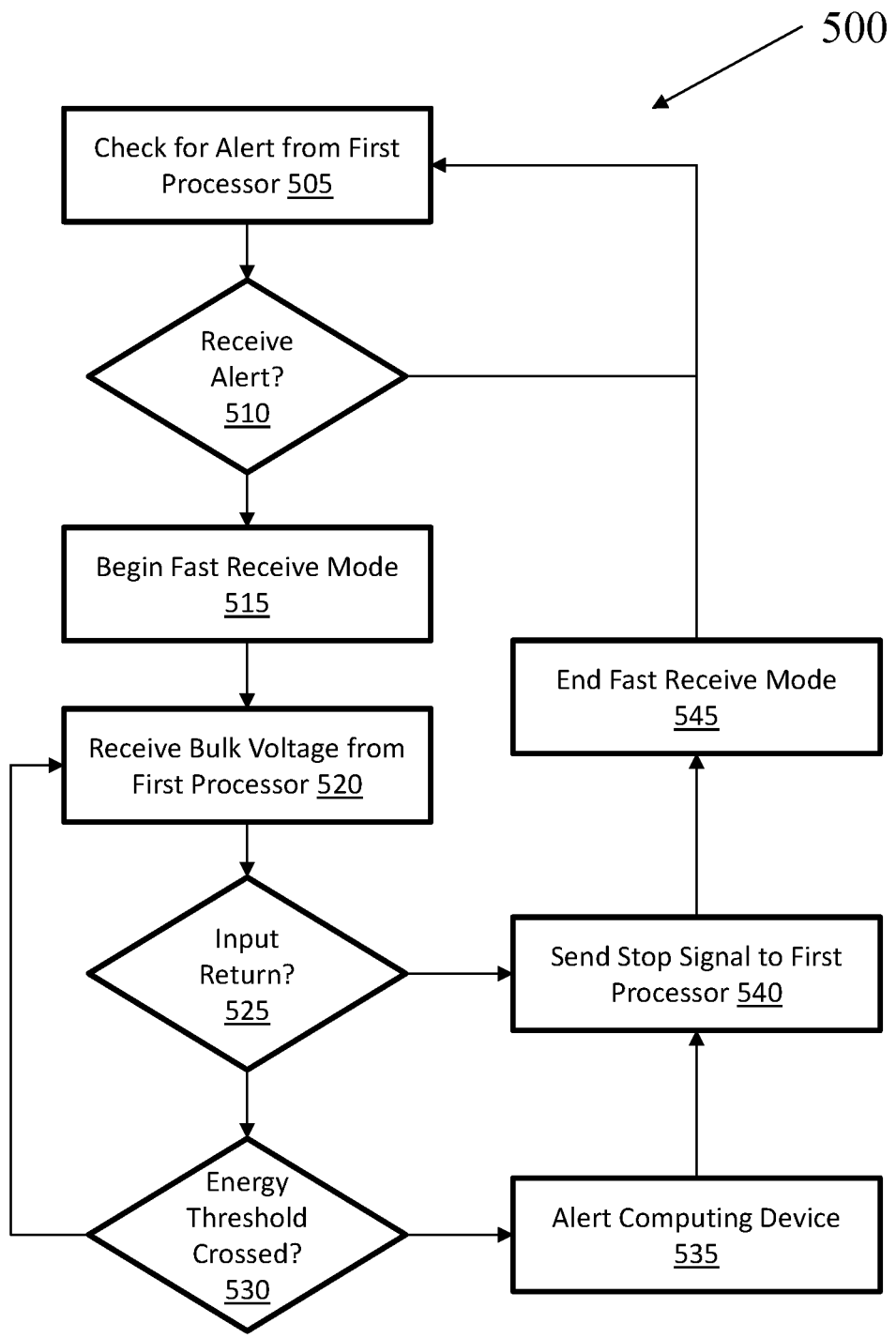
FIG. 5 is a flowchart depicting a method of operation of a second processor in a threshold manager, according to one or more examples of the disclosure.
Figure 6:
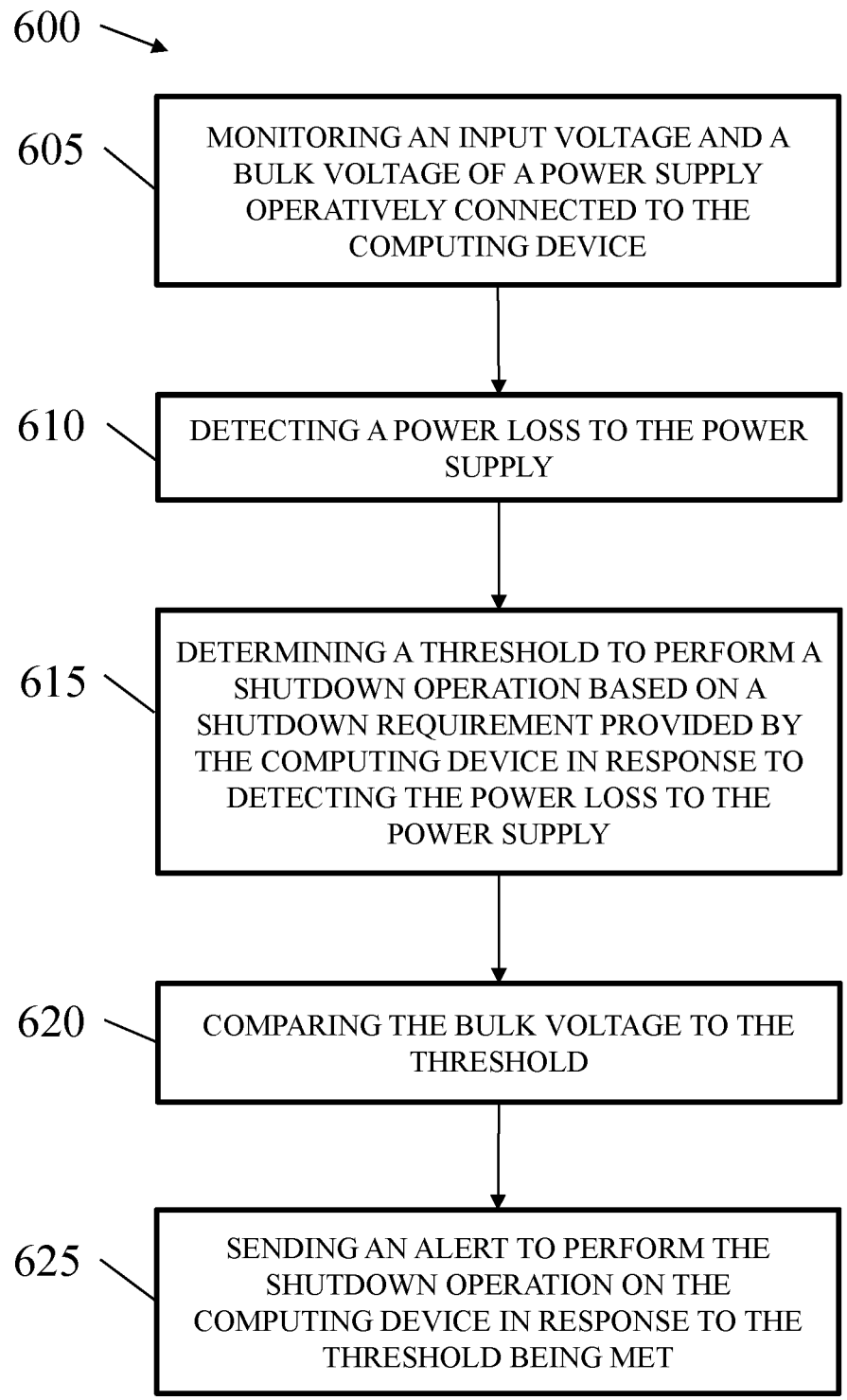
FIG. 6. is a flowchart depicting a method for monitoring a computing device, according to one or more examples of the disclosure.

While FIG. 3 provides a flowchart that depicts method 300 for monitoring a computing system, FIGS. 4-6 may provide additional detail with respect to the operational aspects of specific components used in monitoring the computing system.

Turning to FIG. 4, a flowchart depicting a method 400 of operation of a first processor in a threshold manager, according to one or more examples is shown. In this implementation, a first processor may read (block 405) an input voltage. The input voltage may be read from one or more components of a power supply, such as, for example, a power input and or primary stage of the power supply. The first processor may then determine (block 410) whether the input voltage is within range. If the input voltage is within range, the first processor may continue to read the input voltage as normal.

If the input voltage is not in range, the first processor may alert (block 415) the second processor that the input voltage is out of range. Out of range may be determined by comparing the input voltage to various ranges that may be predetermined and provided to the first processor. Examples of ranges that may be used in certain implementations were provided above with respect to FIG. 3.

If the input voltage is out of range, the first processor may then begin (block 420) fast transmission mode. Fast transmission mode may refer to an accelerated transfer of bulk voltage information from the first processor to the second processor. Fast transmission mode may occur by decreasing the types of energy information that are sent to second processor, such as only sending bulk voltage information. In certain implementations, other energy information, in addition to bulk voltage, may still be provided to second processor, however, the additional energy information may be sent less frequently or otherwise assigned a lower priority. As such, during fast transmission mode, bulk voltage information may be provided to the second processor with increased frequency.

While in fast transmission mode, the first processor may continue to read and transmit (block 425) bulk voltage to the second processor. This process of continuously sending bulk voltage information between the first processor and the second processor may continue until a determination (block 430) is made with respect to the input voltage. If the input voltage has returned to a normal range, the first processor may end (block 435) fast transmission mode, and first processor may go back to normal operating conditions, reading the input voltage as previously indicated. If, however, the input voltage has not returned, the first processor may determine (block 440) whether a stop signal has been received from the second processor.

If no stop signal has been received from the second processor, first processor may continue to read and transmit bulk voltage information to the second processor. If a stop signal has been received from the second processor, the first processor may end (block 430) fast transmission mode, and return to normal operating conditions, as explained above.

The above described operation for the first processor may thereby allow for the monitoring and sending of bulk voltage information from the first processor to the second processor when an input voltage is not within a normal range. Additionally, the first processor may enter a fast transmission mode, and remain in the fast transmission mode until input voltage returns to normal or the first processor is otherwise instructed to return to a normal state by the second processor.

Turning to FIG. 5, a flowchart depicting a method 500 of operation of a second processor in a threshold manager, according to one or more examples is shown. In this implementation a second processor may be operatively connected to a first processor and/or a system processor, as previously explained. In operation, the second processor may check (block 505) for an alert from the first processor. Checking for the alert may occur within a predefined time schedule, for example, every millisecond. In other implementations, the checking may occur more or less frequently, depending on the operational requirements of the power supply and/or the computing device.

The second processor may then determine (block 510) whether an alert was received. If an alert is not received, the second processor may go back to normal operation and check for alerts according to its defined schedule. If an alert is received, the second processor may begin (block 515) fast receive mode. As explained above, when a first processor enters fast transmission mode, the first processor may send bulk voltage information to the second processor with greater frequency. When the second processor begins fast receive mode, the second processor may be conditioned to receive and process the bulk voltage with greater frequency. In order to receive and process the bulk voltage more frequently, second processor may temporarily suspend other processing and or monitoring, thereby dedicating more resources to receiving and processing the data from the first processor.

Once in fast receive mode, the second processor may receive (block 520) bulk voltage from the first processor. This may continue while the second processor makes a determination (block 525) whether voltage input has returned to normal. The determination may occur as a result of receiving notification from the first processor that input voltage has returned to normal. If the input voltage has returned to normal, the second processor may send (block 540) a stop signal to the first processor. The determination may occur as a result of monitoring a bulk capacitor, monitoring a second stage of the power supply, or independently monitoring the power input and/or the first stage of the power supply.

As explained in detail above, second processor may have previously or may be contemporaneously calculating a threshold. The second processor, while receiving the bulk voltage from the first processor, may compare the bulk voltage to the energy threshold and determine (block 530) whether the energy threshold is met or otherwise crossed. If the energy threshold is not met or crossed, the second processor may continue to receive bulk voltage information from the first processor. If the energy threshold is met or otherwise crossed, the second processor may alert (block 535) the computing device. The computing device may then begin a shutdown operation.

After the alert is sent to the computing device, the second processor may send (block 540) a stop signal to the first processor. The stop signal may tell the first processor to stop fast transmission mode and/or stop sending bulk voltage information and/or other energy information because the computing device is entering a shutdown operation. The second processor may also end (block 545) fast receive mode and return to normal operation condition.

Turning to FIG. 6, a flowchart depicting a method 600 for monitoring a computing device, according to one or more examples is shown. In operation, method 600 may include monitoring (block 605) an input voltage and a bulk voltage of a power supply operatively connected to the computing device. The monitoring may include receiving data from one or more components of the power supply, such as a power input and/or primary stage of the power supply. The input voltage data may be received according to a predefined schedule, such as within certain time increments. In certain implementations, the input voltage data may be received substantially continuously so the input voltage at a particular time period is known.

Monitoring the bulk voltage may refer to receiving bulk voltage data from a bulk capacitor of the power supply. The bulk voltage data may also be monitored substantially continuously, thereby allowing the energy available in bulk capacitor to be known or otherwise calculated.

In operation, method 600 may further include detecting (block 605) a power loss to the power supply. Detecting the power loss may occur when an input voltage falls outside of a normal or otherwise specified range. In one implementation, the normal range may refer to a voltage range of acceptable values, for example, between about 100 volts and about 240 volts, or between about 90 volts and about 264 volts. In other implementations, the range may be predefined, such as between about 100 volts and about 150 volts.

In operation, method 600 may further include determining a threshold to perform a shutdown operation based on a shutdown requirement provided by the computing device in response to detecting the power loss to the power supply. As explained in detail above, a threshold may be calculated based on the shutdown requirements provided by the computing device. For example, the shutdown requirement may be determined by calculating a data transfer time and a minimum output voltage to perform the shutdown operation.

In certain implementations, the threshold may further include information provided to the power supply and/or components thereof at the time of manufacture or at some other time. The threshold may define the amount of power, energy, voltage, etc., that will allow the computing device to perform a shutdown operation. As such, the threshold may be calculated based on the shutdown requirements, a bulk capacitance, a shutdown bulk voltage, and/or other variables as may be used in certain power supplies and computing devices. In certain implementations, the threshold may be dynamically modified based on operating conditions of the computing device, or the threshold may be a fixed value that is determined based on the energy, power, voltage, etc., required by the computing device under maximum load. In certain implementations, the computing device may provide updated shutdown requirements that may be used to modify the threshold.

In operation, method 600 may further include comparing (block 620) the bulk voltage to the threshold and sending (block 625) an alert to perform the shutdown operation on the computing device in response to the threshold being met. In certain implementations, the comparing the bulk voltage to the threshold may include the determination that the threshold is either met or exceeded. In other implementations, when calculating the threshold, a safety margin may be introduced such that the energy loss by the bulk capacitor during the time the comparison is made is accounted for, so that even if the threshold is exceeded, the computing device still has the ability to perform a shutdown operation. This safely margin may include for example, a calculation that provides about 5 percent, about 10 percent, 15, about percent, about 20 percent, or another value of energy, power, voltage, etc., to account for processing and transmittance time within the power supply and/or the computing device.

In certain implementations, method 600 may further include accelerating data transfer within the power supply in response to detecting the power loss to the computing device. As explained above, the power supply may have two or more processors and, when the power loss is detected, the processor that is monitoring the bulk voltage may increase the frequency with which bulk voltage information is provided to the second processor. In such an implementation, the second processor may calculate the threshold and/or communicate with the computing device to alert the computing device to perform a shutdown operation.

Figure 7:
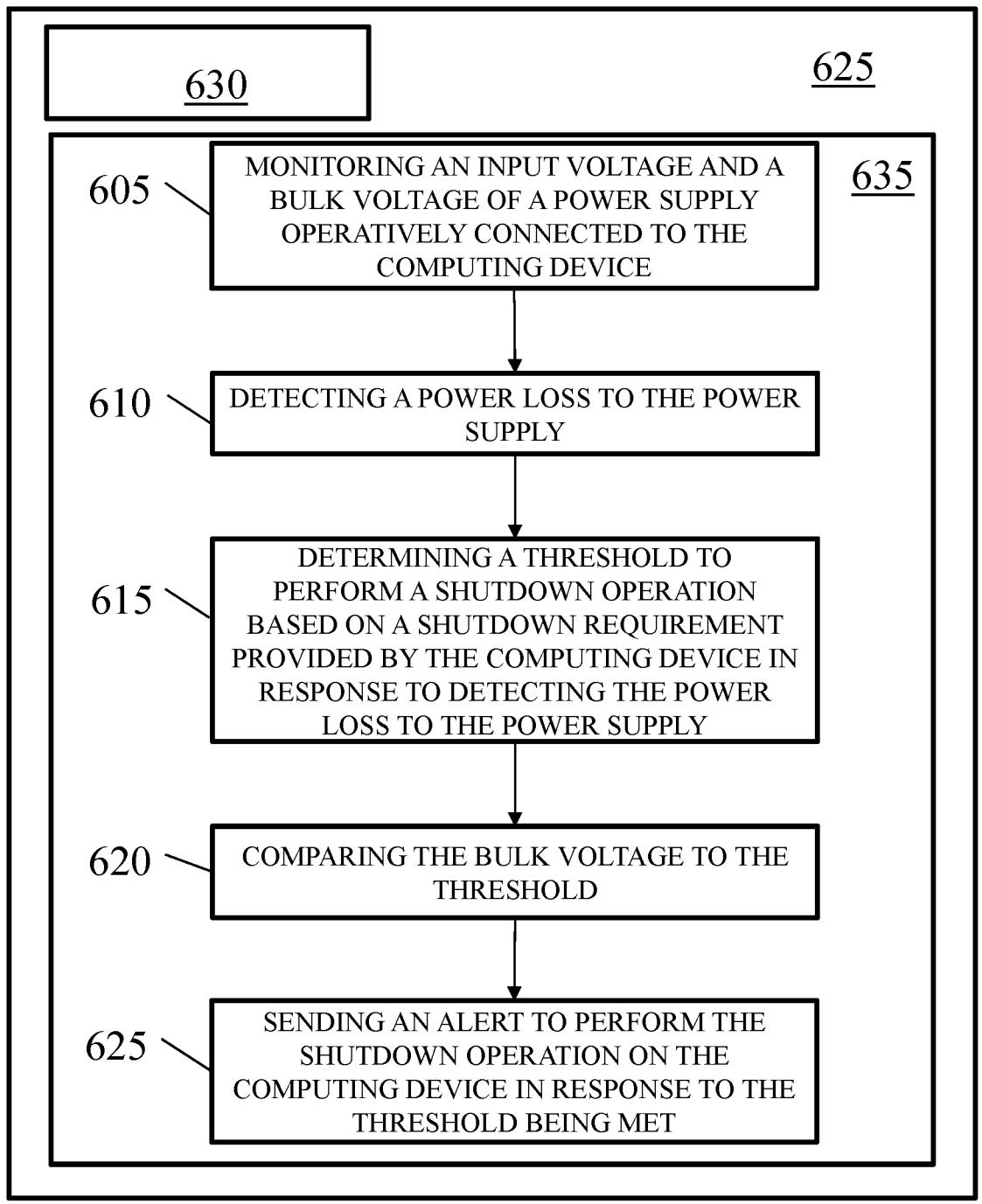
FIG. 7 is an example computing device with a hardware processor and accessible machine-readable instructions, according to one or more examples of the disclosure.

Turning to FIG. 7, an example computing device with a hardware processor and accessible machine-readable instructions, according to one or more examples is shown. FIG. 7 provides an example computing device 625, with a hardware processor 630, and accessible machine-readable instructions stored on a machine-readable medium 635 for generating information about a product as discussed above with respect to one or more disclosed example implementations. FIG. 7 illustrates computing device 625 configured to perform the flow described in blocks 605, 610, 615, 620, and 625 discussed in detail with respect to FIG. 6. However, computing device 625 may also be configured to perform the flow of other methods, techniques, functions, or processes described in this disclosure.

A machine-readable storage medium, such as 635 of FIG. 7, may include both volatile and nonvolatile, removable and non-removable media, and may be any electronic, magnetic, optical, or other physical storage device that contains or stores executable instructions, data structures, program module, or other data accessible to a processor, for example firmware, erasable programmable read-only memory ("EPROM"), random access memory ("RAM"), non-volatile random access memory ("NVRAM"), optical disk, solid state drive ("SSD"), flash memory chips, and the like. The machine-readable storage medium may be a non-transitory storage medium, where the term "non-transitory" does not encompass transitory propagating signals.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A power supply comprising:
a power input to connect to a power source to receive an input power for the power supply;
a bulk capacitor operatively connected to the power input; and
a threshold manager having a first processor operatively connected to the power input and the bulk capacitor, the threshold manager to:
monitor the input power,
calculate a threshold to perform a shutdown operation based on a shutdown requirement provided by a computing device, and
in response to a power loss of the input power, monitor a bulk voltage of the bulk capacitor and send an alert to the computing device to perform the shutdown operation when the bulk voltage meets the threshold;
wherein the threshold manager further comprises a second processor operatively connected to the first processor and the computing device; and
wherein the first processor transmits energy information to the second processor and, in response to detecting the power loss, increases a speed the energy information is transmitted.

2. The power supply of claim 1, wherein the threshold manager sets the threshold such that when the bulk voltage equals the threshold, the bulk capacitor stores sufficient energy to enable the computing device to perform the shutdown operation without the bulk voltage dropping below a minimum output voltage specified by the shutdown requirement.

3. The power supply of claim 1, wherein the threshold manager is to:
determine an amount of power and a minimum bulk voltage required for the shutdown operation based on the shutdown requirement, and
set the threshold to equal a value of the bulk voltage at which removing the amount of power required for the shutdown operation from the bulk capacitor would change the bulk voltage to the minimum bulk voltage.

4. The power supply of claim 1, wherein the shutdown requirement includes an amount of time for the shutdown operation and a minimum output voltage to perform the shutdown operation.

5. The power supply of claim 4, wherein the threshold is calculated based on the shutdown requirement, a bulk capacitance, and a shutdown bulk voltage.

6. The power supply of claim 1, wherein the threshold manager is to adjust the threshold in response to a modification to the shutdown requirement.

7. The power supply of claim 1, wherein the threshold manager is to monitor the bulk capacitor to detect a change in energy storage.

8. The power supply of claim 1, further comprising:
a primary stage having a transformer operatively connected to the power input, the bulk capacitor, and the threshold manager; and
a secondary stage operatively connected to the bulk capacitor, the computing device, and the threshold manager.

9. A system comprising:
a system processor to determine a shutdown requirement for the system;
a power supply operatively connected to the system, the power supply comprising a bulk capacitor operatively connected to a power input and a threshold manager, the threshold manager operatively connected to the power input and the bulk capacitor, the threshold manager to:
monitor an input voltage into the power supply,
calculate a threshold to perform a shutdown operation based on the shutdown requirement provided by the system processor, and
in response to a power loss of the input power, monitor a bulk voltage of the bulk capacitor and send an alert to the system processor to perform the shutdown operation when the bulk voltage meets the threshold;
wherein a first processor of the threshold manager is to transmit energy information to a second processor of the threshold manager and, in response to detecting the power loss, increase a speed the energy information is transmitted.

10. The system of claim 9, wherein the system processor is to modify the shutdown requirement.

11. The system of claim 9, wherein the threshold is calculated based on the shutdown requirement, a bulk capacitance, and a shutdown bulk voltage.

12. A method for monitoring a computing device, the method comprising:
monitoring an input voltage and a bulk voltage of a bulk capacitor in a power supply operatively connected to the computing device;
detecting a power loss to the power supply;
determining a threshold to perform a shutdown operation based on a shutdown requirement provided by the computing device in response to detecting the power loss to the power supply;
comparing the bulk voltage to the threshold; and
sending an alert to perform the shutdown operation on the computing device in response to the threshold being met;
accelerating data transfer of energy information between a first processor and a second processor within the computing device in response to detecting the power loss to the power supply.

13. The method of claim 12, wherein the shutdown requirement is determined by calculating a data transfer time and a minimum output voltage to perform the shutdown operation.

14. The method of claim 12, wherein the threshold is calculated based on the shutdown requirement, a bulk capacitance, and a shutdown bulk voltage.

15. The method of claim 12, further comprising modifying the threshold based on a change to the shutdown requirement provided by the computing device.

16. The method of claim 12, wherein the monitoring, detecting, determining, and comparing is performed by a processor of the power supply.

* * * * *